United States Patent [19]

Ohya et al.

[11] Patent Number: 4,684,843
[45] Date of Patent: Aug. 4, 1987

[54] PIEZO-RESONATOR AND MANUFACTURING METHOD THEREFOR

[75] Inventors: Kanji Ohya; Hikaru Achiha, both of Aichi, Japan

[73] Assignee: NGK Spark Plug Co., Ltd., Aichi, Japan

[21] Appl. No.: 442,991

[22] Filed: Nov. 19, 1982

[30] Foreign Application Priority Data

Nov. 20, 1981 [JP] Japan .............................. 56-173907[U]

[51] Int. Cl.$^4$ ............................................ H01L 41/08
[52] U.S. Cl. ................................... 310/355; 310/344; 310/348
[58] Field of Search ........ 310/340, 344, 348, 353-355, 310/356

[56] References Cited

U.S. PATENT DOCUMENTS

| | | | |
|---|---|---|---|
| 3,619,672 | 11/1971 | Nagata et al. | 310/344 |
| 3,622,816 | 11/1971 | McGrew | 310/344 X |
| 3,679,919 | 7/1972 | Ichinose et al. | 310/355 |
| 4,382,203 | 5/1983 | Tribby et al. | 310/355 |

Primary Examiner—Mark O. Budd
Attorney, Agent, or Firm—Sughrue, Mion, Zinn, Macpeak, and Seas

[57] ABSTRACT

In a piezo-resonator in which the resonator cavity is coated with a resinous insulator, a lip which defines a ridge for the mounting of the terminal strips to the resonator is fused to the outer surface of the strips. The seal produced thereby prevents resin from invading the resonator cavity during the resin coating process.

1 Claim, 3 Drawing Figures

PIEZO-RESONATOR AND MANUFACTURING METHOD THEREFOR

BACKGROUND OF THE INVENTION

The present invention relates generally to piezo-resonator structures, and is particularly directed to a piezo-electric ceramic resonator in which the resin which accumulates during the formation of the outer shell is prevented from entering the resonator frame.

Piezo-resonator structures are a matter of well known prior art. In general, piezo-resonators are constructed by inserting a ceramic resonator into a cavity defined by an insulating frame and a plurality of metallic terminal strips. The terminal strips establish electrical contacts to the electrode surfaces of the resonator. The periphery of the resonator cavity is then coated with an insulating outer shell made of synthetic resin.

The above-described construction of the piezo-resonator is disadvantageous in that resin can leak into the resonator cavity at gaps between the terminal strips and the frame. This leakage of the resin into the resonator cavity results in the adhesion of the resin to the resonator which restricts the vibratory oscillations of the resonator and degrades the resonator performance thereby. Since such degraded performance cannot be tolerated, these cavity piezo-resonators must be discarded, which greatly increases production costs.

SUMMARY OF THE INVENTION

It is thus an object of the present invention to eliminate the leakage of resin material into the resonator cavity.

It is another object of the present invention to reduce the production costs of piezo-resonators by reducing the percentage of manufactured piezo-resonators which are faulty.

The above and other objects of the present invention are realized by fusing the frame which defines the resonator cavity with the terminal strips which establish the electrical contacts to the resonator. This fusion produces a seal which prevents the resin from entering the resonator cavity.

DETAILED DESCRIPTION OF THE PREFERRED EMBODIMENTS

Figure 1:
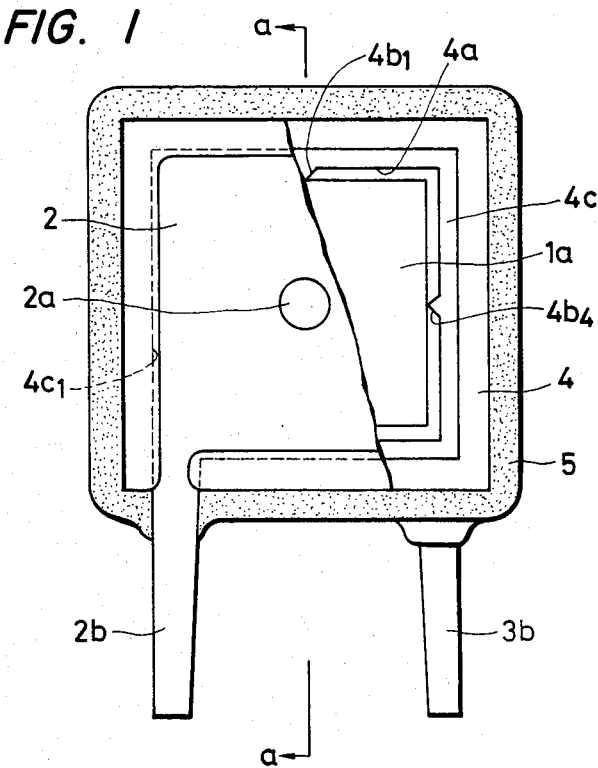
FIG. 1 is a front view of the resonator with the upper layer portion of the insulating outer shell and portions of the terminal strips cut away.
Figure 2:
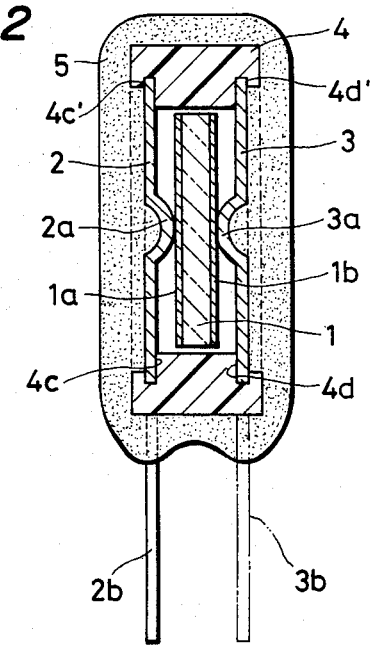
FIG. 2 is a cross section of the resonator sectionally taken on a—a line in FIG. 1.
Figure 3:
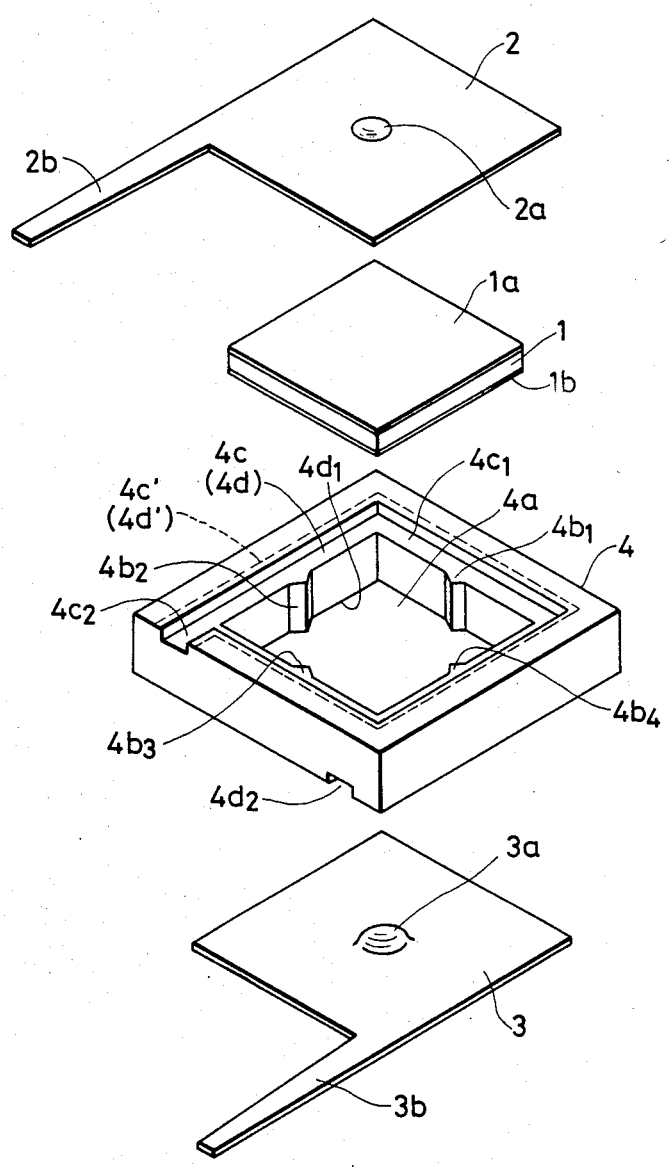
FIG. 3 is an exploded perspective view of the resonator.

Referring to FIGS. 1 and 2, a piezo-electric ceramic resonator 1 is shown which has a pair of silver electrodes 1a and 1b which are formed and deposited onto the opposite sides of the resonator by any one of a number of conventional means. The ceramic resonator may be either a disc-like resonator vibrating in radial directions, or a rectangular plate resonator vibrating at its contour. While it is preferred that the latter resonator be used in the embodiment of the present invention, it is by no means intended to be limitative on the scope thereof. The plate resonator has vibrational nodes at the central portions of the electrode surfaces 1a and 1b and at the central portions of the fringes. A pair of generally rectangular shaped terminal strips 2 and 3 are formed by stamping out a metal sheet having good electroconductive and elastic characteristics (such as phosphor bronze). Each terminal strip is provided at the central portion thereof with a small semi-circular, elastic protrusion 2a or 3a which forms an electrical contact between the strips and the sides of the aforementioned piezo-electric ceramic resonator 1. Further, the strips have legs 2b and 3b, respectively, which extend straighforwardly from one corner of the lower sides thereof. With reference to FIGS. 1 and 3, an insulating frame 4 composed of synthetic resin has a rectangular through aperture 4a and small triangular protrusions $4b_1$–$4b_4$ at the centers of the respective sides thereof. As shown most clearly in FIG. 3, the frame 4 is provided on each side with circumferential recesses $4c_1$ and $4d_1$, respectively, which extend about the outer periphery of the aperture 4a. The portions of the recess $4c_1$ and $4d_1$ indicated at 4c and 4d communicate with notches $4c_2$ and $4d_2$, respectively, each of which extends from one corner of each recess through the peripheral legs to an outer edge of the frame.

The piezo-electric resonator 1 is mechanically supported within the aperture 4a of the frame by bringing the small protrusions $4b_1$–$4b_4$ into mating engagement with the peripheral (i.e. non-vibratory) sides of the resonator. Further, the protrusions 2a and 3a of the terminal strips are brought into electrical contact with the centers of the electrode (i.e. vibratory) surfaces 1a and 1b of the resonator by inserting the outer peripheries of the terminal strips 2 and 3 into the recesses $4c_1$ and $4d_1$ on the opposite sides of the frame 4 with the legs 2b and 3b extending outwardly through recesses $4c_2$ and $4d_2$, respectively. The frame 4 is held within an insulating outer shell 5 of synthetic resin which covers the insulating frame 4 entirely. Likewise, the terminal strips 2 and 3 are covered by the insulating outer shell.

In the preferred embodiment of the present invention, the outer wall portions $4c_1$ and $4d_1$ of recesses 4c and 4d are fused over the periphery of each strip 2 and 3 by means of a heater, ultrasonic vibration or the like. Specifically, as shown in FIG. 3, the dashed portion of the lip surrounding the recess $4c_1$ is fused to the abutting side of the terminal strip 2.

Heretofore, as previously described, piezo-electric resonators of this kind have been constructed by inserting a piezo-electric resonator in concavity of an insulating frame, and inserting terminal strips into the recesses on the opposite sides of the frame which establish on electrical contact with electrode surfaces of the recessed resonator. The outer periphery of the frame is then coated with an insulating outer shell of synthetic resin by means of dipping, powder coating, transfer molding or other similar means. Such a conventional device is disadvantageous in that gaps between the recesses and the terminal strips permit intrusion of some of the resin into the inside of the frame during the forming of this outer shell. As previously mentioned, the resin intrusion results in adhesion of the resin to the piezo-electric ceramic resonator which deteriorates the resonance characteristics thereof.

In a piezo-resonator device constructed according to the present invention, resin is prevented from intruding into the inside of the frame during the forming of the outer shell. The outer wall portions 4c' and 4d' of the recesses $4c_1$ and $4d_1$ of the insulating frame 4 are fused over the edges of strips 2 and 3 for attachment to the mating terminal strips 2 and 3. In other words, as shown in FIGS. 1 and 2, the outer wall portions 4c' and 4d' are melted down and are pressed into contact with the peripheries of terminal strips 2 and 3 which are then coated with the resinous shell 5. As a result, the present invention reduces the possibilities of producing inferior resonators, which substantially lowers the product price.

What is claimed is:

1. A piezo-resonator comprising an insulating frame of synthetic resin material having two major opposed sides and an aperture extending therethrough, lip means located on each major side about the outer periphery thereof to define a pair of recesses in the major sides adjacent said apertures, a piezo-electric ceramic resonator having two electrode surfaces located in said aperture, a pair of terminal plates disposed in said recesses, respectively, in electrical contact with said electrode surfaces of said resonator, a pair of notches located in said lip means on opposite sides of said frame, respectively, in communication with said recesses, said terminal plates each having an outer peripheral edge portion located in a respective recess with said lip means disposed in overlying relation thereto and a leg portion projecting outwardly of said frame through a respective notch, and an insulating outer shell of synthetic resin covering said frame with said leg portion of each terminal strip extending outwardly therethrough.

* * * * *